(12) United States Patent
Vuille et al.

(10) Patent No.: US 10,301,732 B2
(45) Date of Patent: May 28, 2019

(54) METHOD FOR FABRICATION OF A TIMEPIECE PROVIDED WITH A MULTI-LEVEL EXTERIOR ELEMENT

(71) Applicant: The Swatch Group Research and Development Ltd, Marin (CH)

(72) Inventors: Pierry Vuille, Les Emibois (CH); Yoann Mosteiro Vazquez, Cortaillod (CH); Pascal Grossenbacher, Neuchatel (CH)

(73) Assignee: The Swatch Group Research and Development Ltd, Marin (CH)

(*) Notice: Subject to any disclaimer, the term of this patent is extended or adjusted under 35 U.S.C. 154(b) by 0 days.

(21) Appl. No.: 15/640,650

(22) Filed: Jul. 3, 2017

(65) Prior Publication Data
US 2018/0016686 A1    Jan. 18, 2018

(30) Foreign Application Priority Data

Jul. 6, 2016   (EP) .................................... 16178118

(51) Int. Cl.
*C25D 1/00* (2006.01)
*B81C 99/00* (2010.01)
(Continued)

(52) U.S. Cl.
CPC ............ *C25D 1/003* (2013.01); *B81C 99/008* (2013.01); *C23C 16/48* (2013.01); *G04B 19/042* (2013.01);
(Continued)

(58) Field of Classification Search
None
See application file for complete search history.

(56) References Cited

U.S. PATENT DOCUMENTS

| 2,594,820 A | * | 4/1952 | Stern | ...................... G04B 19/06 205/120 |
| 5,242,711 A | | 9/1993 | Denatale et al. | |

(Continued)

FOREIGN PATENT DOCUMENTS

| CH | 708 827 A2 | | 5/2015 | |
| EP | 1916567 | * | 4/2008 | ............ C25D 1/003 |

(Continued)

OTHER PUBLICATIONS

European Search Report dated Jan. 13, 2017 in European application 16178118.2, filed on Jul. 6, 2016.

*Primary Examiner* — Stefanie S Wittenberg
(74) *Attorney, Agent, or Firm* — Oblon, McClelland, Maier & Neustadt, L.L.P.

(57) ABSTRACT

A method for fabrication of a piece including, superposing an electrically insulating layer including a first orifice, an additional layer including a first aperture, an intermediate layer including a first hole, and a base layer surmounted by a base motif, depositing a metal layer, so that at the end of this step, the metal layer forms a shell covering electrically conductive walls of the base motif, of the first orifice, of the first aperture and of the first hole, and includes a lateral area resting on the insulating layer, dissolving the insulating layer, coating the metal or alloy layer with a volume formed by a base material of the piece, so that the volume conforms to the shapes of the metal layer.

17 Claims, 2 Drawing Sheets

(51) Int. Cl.
*G04B 19/04* (2006.01)
*C23C 16/48* (2006.01)
*G04D 3/00* (2006.01)

(52) U.S. Cl.
CPC ...... *B81C 2201/032* (2013.01); *G04D 3/0069* (2013.01); *G04D 3/0074* (2013.01); *G04D 3/0092* (2013.01)

(56) References Cited

U.S. PATENT DOCUMENTS

| | | | |
|---|---|---|---|
| 5,334,342 A | | 8/1994 | Harker et al. |
| 6,189,448 B1 | * | 2/2001 | O'Neal ................. B41F 15/36 101/127 |
| 2011/0020754 A1 | | 1/2011 | Fiaccabrino |
| 2016/0179057 A1 | | 6/2016 | Stranczl |

FOREIGN PATENT DOCUMENTS

| | | | | |
|---|---|---|---|---|
| EP | 2060534 | * | 5/2009 | ......... B81C 99/0095 |
| EP | 2 229 470 | | 9/2010 | |
| EP | 2405300 | * | 1/2012 | ............... B81C 1/00 |
| EP | 3 035 128 A1 | | 6/2016 | |
| JP | 11323592 | * | 11/1999 | ............... C25D 1/10 |
| WO | WO 2009/083488 A1 | | 7/2009 | |

\* cited by examiner

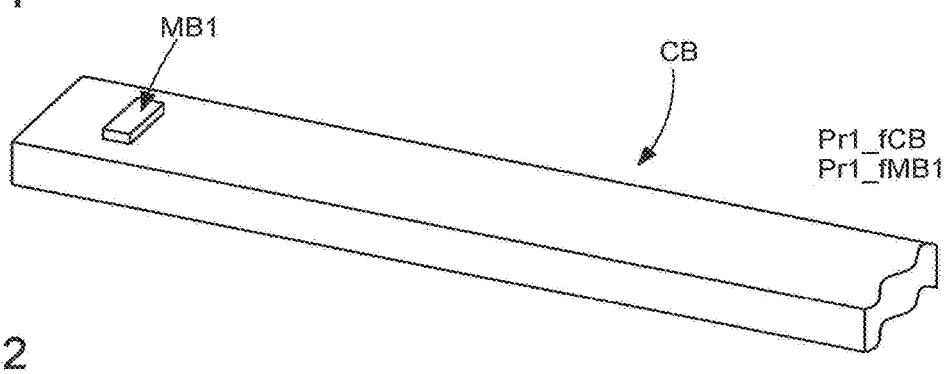
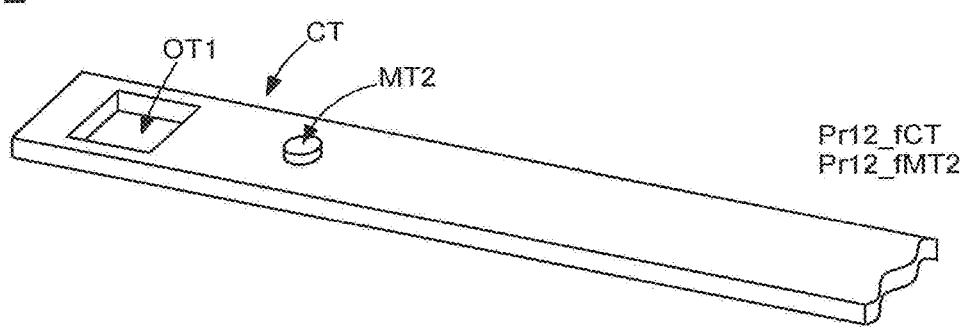
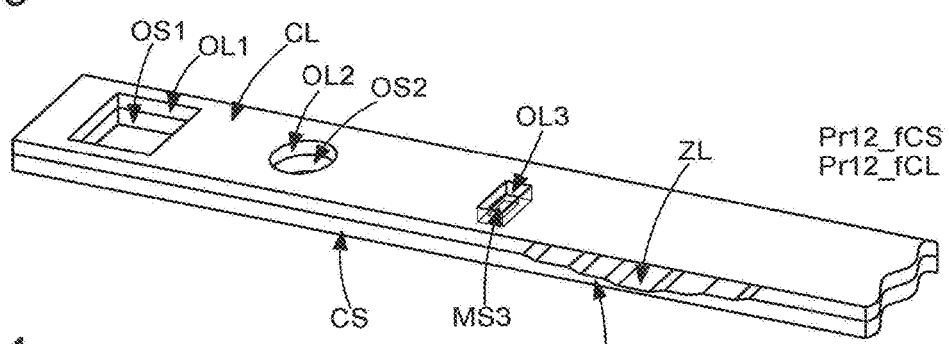
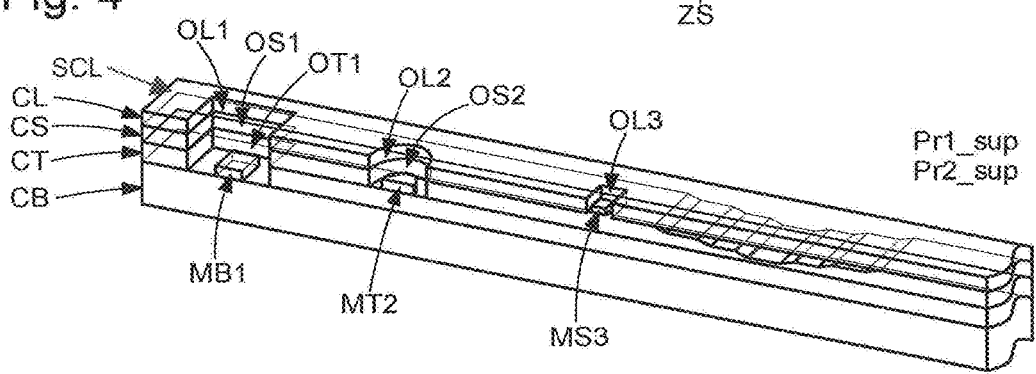

METHOD FOR FABRICATION OF A TIMEPIECE PROVIDED WITH A MULTI-LEVEL EXTERIOR ELEMENT

This application claims priority from European Patent Application No. 16178118.2 filed on Jul. 6, 2016, the entire disclosure of which is hereby incorporated herein by reference.

FIELD OF THE INVENTION

The invention relates to a method for fabrication of a piece, such as a timepiece, or piece of jewelry, for example a watch dial, a bezel, a crown, a bracelet link, a clasp, etc., or a tool piece such as a punching tool, a mould, etc. The method more particularly makes it possible to produce a piece comprising a piece body and a multi-level exterior element in relief on the piece body, with the exterior element being an hour indicator, a decorative element, a letter, etc. "Multi-level" means that the element includes at least two visible flat faces, which extend parallel to each other and parallel to the piece body.

BACKGROUND OF THE INVENTION

In the field of horology and jewelry, it is conventional to produce multi-level exterior elements using photolithography and electrodeposition techniques. EP Patent 2316056 B1 notably describes a method for fabrication of a multi-level element made of metal or metal alloy, using the UV-LIGA technique. This method includes the following steps:
taking a substrate having a conductive surface
coating the conductive surface of the substrate with a first layer of photosensitive resin
irradiating the first layer of photosensitive resin through a mask corresponding to a desired pattern
developing the first photosensitive resin layer so as to create apertures therein and thereby obtain a first level of a resin mould, the apertures in the first resin layer revealing the conductive surface of the substrate
depositing another photosensitive resin layer on the developed resin layer, so as to coat the latter and, preferably, fill the apertures therein
irradiating the new photosensitive resin layer through a mask corresponding to the desired pattern
developing the new photosensitive resin layer so as to create apertures therein and to obtain a multi-level resin mould, the apertures in the multi-level mould revealing the conductive surface of the substrate
filling the apertures in the multi-level resin mould with a metal or with an alloy, by electrodeposition
removing the resin layers to reveal a multi-level metal or alloy element formed by said metal or alloy deposited in the apertures.

The multi-level elements thus fabricated are then separated from the substrate and mounted on the body of a timepiece or piece of jewelry.

This method for fabrication of pieces provided with multi-level exterior elements has the drawback of being time consuming to implement, especially because it is necessary to completely fill the mould apertures during the electrodeposition. A second drawback is the need to assemble the exterior elements on the piece body, resulting in a risk of detachment in the event of shocks, for example.

SUMMARY OF THE INVENTION

It is an object of the present invention to overcome all or part of the aforementioned drawbacks.

To this end, according to a first embodiment, the invention relates to a method for fabrication of a piece provided with an exterior element, including the following steps:
Superposing an electrically insulating layer comprising a first through orifice, an additional layer comprising a first through aperture of similar dimensions to the first orifice, an intermediate layer including a first through hole, and a base layer surmounted by a base motif, so as to place the base motif inside the first hole, covering the first hole with the first aperture, and superposing the first aperture and the first orifice
Electrodepositing a metal or metal alloy layer, so that at the end of this step, the metal or metal alloy layer forms a shell covering electrically conductive walls of the base motif, of the first orifice, of the first aperture and of the first hole, and comprises a lateral area resting on the insulating layer
Dissolving the insulating layer
Coating the metal or metal alloy layer with a volume at least partly formed by a base material of the piece, so that the volume conforms to the shapes of the metal or metal alloy layer
Removing the volume and the metal or metal alloy layer.

According to a second embodiment, the invention relates to a method for fabrication of a piece provided with an exterior element including the following steps:
Superposing an electrically insulating layer comprising a second through orifice, an additional layer comprising a second through aperture of similar dimensions to the second orifice, and an intermediate layer surmounted by an intermediate motif, so as to place the intermediate motif inside the second aperture, and superposing the second aperture and the second orifice
Electrodepositing a metal or metal alloy layer, so that at the end of this step, the metal or metal alloy layer forms a shell covering electrically conductive walls of the intermediate layer, of the second orifice and of the second aperture, and comprises a lateral area resting on the insulating layer
Dissolving the insulating layer
Coating the metal or metal alloy layer with a volume of material at least partly formed by a base material of the piece, so that the volume conforms to the shapes of the metal or metal alloy layer
Removing the volume and the metal or metal alloy layer.

The method according to the first and second embodiment makes it possible to simultaneously fabricate the piece body (formed by the base material volume of the piece) and the exterior element (formed by the metal or alloy layer). The exterior element is directly fixed to the piece body, with no need for an assembly step. Indeed, the lateral area of the metal or alloy layer resting on the insulating layer at the end of the deposition phase, is sealed inside the volume at the end of the coating phase.

Further, the method according to the first or second embodiment is faster to implement than the prior art method described above. Indeed, the electrodeposition time is shorter, since the metal or alloy layer does not need to fill the orifices, apertures and holes (forming a mould), but simply has to coat their walls and the motif. In other words, the metal or metal alloy structure is not solid, on the contrary, it forms a hollow shell. The thickness to be deposited by electrodeposition is thus smaller.

The interfaces between the piece body and the exterior element are clean, with no burrs. Further, by choosing suitable shapes and dimensions for the various motifs or pattern's, apertures, orifices or holes involved in the fabrication methods, it is possible to produce exterior elements of varied shapes and dimensions. Further, a texture that is on the additional layer is etched, by an imprinting effect, on the piece body (the base material volume of the piece).

Further, the fabrication method according to the first embodiment (first method) may comprise one or more of the following features, taken independently or in all technically possible combinations.

According to a non-limiting embodiment, the first method includes a step of forming electrically conductive surfaces on the walls of the base motif, of the first orifice, of the first aperture and/or of the first hole, for example by a physical vapour deposition technique.

According to a non-limiting embodiment, the first method includes a step of forming an electrically conductive surface on one portion of an upper face of the insulating layer located at the periphery of the first orifice.

According to a non-limiting embodiment, the first method includes a step of forming the base motif on the base layer, including an application, irradiation and development of a photosensitive resin, for example an SU8 resin.

According to a non-limiting embodiment, the first method includes a step of forming a base layer from a silicon wafer, including coating said wafer with a conductive film.

Further, the method according to the first embodiment and/or the second embodiment may comprise one or more of the following features, in all technically possible combinations.

According to a non-limiting embodiment, the method includes a step of forming electrically conductive surfaces on the walls of the intermediate motif, of the second orifice and/or of the second aperture.

According to a non-limiting embodiment, the method includes a step of forming an electrically conductive surface on one portion of an upper face of the insulating layer located at the periphery of the second orifice.

According to a non-limiting embodiment, the method includes a step of forming the intermediate motif on the intermediate layer, including an application, irradiation and development of a photosensitive resin, for example an SU8 resin.

According to a non-limiting embodiment, the method includes a step of forming the intermediate layer including cutting, for example laser cutting, of a plate, for example made of brass.

According to a non-limiting embodiment, the method includes a step of forming the additional layer including cutting, for example laser cutting, of a plate, for example made of brass.

According to a non-limiting embodiment, the step of forming the additional layer includes stamping the additional layer to form therein an additional motif, the electrically insulating layer including a third orifice, the third orifice being placed facing the additional motif when the insulating layer and the additional layer are superposed.

According to a non-limiting embodiment, the step of forming the additional layer includes etching the additional layer, so as to locally diminish its thickness, the insulating layer including areas of excess thickness so that the assembly comprising the superposed additional layer and insulating layer is of constant thickness.

According to a non-limiting embodiment, the method includes a step of forming the insulating layer including an application, irradiation and development of a photosensitive resin, for example an SU8 resin, on the additional layer, so as to form a third orifice, the third orifice being placed facing the additional motif when the insulating layer and the additional layer are superposed.

According to a non-limiting embodiment, the volume is partly formed of a second material, different from the base material, so that the second material fills the space inside the metal or metal alloy shell.

According to a non-limiting embodiment the method includes a step of cutting the lateral area, performed before the coating step.

BRIEF DESCRIPTION OF THE DRAWINGS

Other features and advantages will appear clearly from the following description, given by way of non-limiting illustration, with reference to the annexed drawings, in which:

FIG. 1 is a schematic representation of a base layer used in a method according to a non-limiting embodiment of the invention, the method making it possible to produce a piece provided with at least one multi-level exterior element FIG. 2 is a schematic representation of an intermediate layer used in the method FIG. 3 is a schematic representation of an additional layer and an electrically insulating layer, said layers being used in the method FIG. 4 represents a step of superposing the layers of FIGS. 1, 2 and 3, according to the method

DETAILED DESCRIPTION OF PREFERRED EMBODIMENTS

Figure 7:
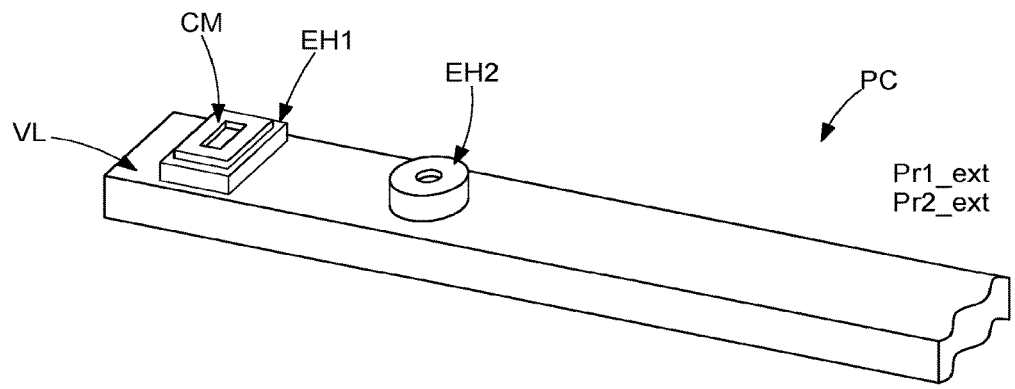
FIG. 7 represents the final piece obtained by the method, the piece being provided with two multi-level exterior elements.

The present description concerns two fabrication methods Pr1, Pr2, the combined implementation of which makes it possible to fabricate a timepiece PC provided with two multi-level exterior elements EH1, EH2 such as that represented in FIG. 7. More particularly, the first exterior element EH1 is obtained by the first method Pr1, while the second exterior element EH2 is obtained by the second method Pr2. Since the two methods Pr1, Pr2 comprise common steps and use common elements, the combined implementation thereof makes it possible to fabricate a piece provided with these two exterior elements. However, methods Pr1, Pr2 could be performed independently of each other, to form not one piece provided with two exterior elements, but two pieces each provided with one exterior element. Further, methods Pr1, Pr2 could apply to all sorts of pieces, for example a piece of jewelry, or a tool piece, and all sorts of multi-level external elements. Finally, the piece could naturally include more than one exterior element of each type.

FIGS. 1 to 3 show four layers CB, CT, CS and CL, which are then superposed on one another in a superposition step of the fabrication method. Each of layers CB, CT, CS and CL is metallic, or made of metal alloy, or mineral. However, if one layer is mineral, some areas thereof must be made electrically conductive, for example by a physical vapour deposition technique (or "PVD"), as explained in the following description.

FIG. 1 represents a base layer CB surmounted by a base motif MB1. The CB/MB1 assembly was obtained by a step Pr1_fCB of forming base layer CB followed by a step Pr1_fMB1 of forming base layer MB1 according to first method Pr1. In a non-limiting embodiment of step Pr1_fCB, base layer CB is formed of a substrate, for example a silicon wafer. In a non-limiting embodiment, said substrate is coated with an electrically conductive film by PVD. This step is not obligatory, as explained in the text below, some parts of base layer CB may be made conductive in a subsequent step of the method, by a method such as PVD or through contact with a conductive layer. In a non-limiting embodiment of step Pr1_fMB1, base motif MB1 is formed by:

applying a photosensitive resin to base layer CB, for example an SU-8 type resin irradiating the resin through a photomask corresponding to the desired shape of base motif MB1, with ultraviolet rays in the case of an SU-8 resin, to cure an area of the resin corresponding to base motif MB1 developing the resin, to dissolve the uncured areas and reveal base motif MB1.

In another non-limiting embodiment of step Pr1_fMB1, base motif MB1 is formed by depositing a uniform layer (of lacquer or otherwise) which is then selectively laser ablated.

FIG. 2 shows an intermediate layer CT comprising a first through hole OT1 surmounted by an intermediate motif MT2. The CT/MT2 assembly was obtained by a step Pr12_fCT of forming intermediate layer CT followed by a step Pr12_fMT2 of forming intermediate motif MT2 according to first and second methods Pr1, Pr2. In a non-limiting embodiment of step Pr12_fCT, intermediate layer CT is formed of a metal alloy plate, for example made of brass, which is cut, for example by laser, to obtain first hole OT1. It is noted that first hole OT1 is of smaller dimensions than first aperture OS1 of FIG. 3. In a non-limiting embodiment of step Pr12_fMT2, intermediate motif MT2 is formed by:

applying a photosensitive resin to intermediate layer CT, for example an SU-8 type resin irradiating the resin through a photomask corresponding to the desired shape of intermediate motif MT2, with ultraviolet rays in the case of an SU-8 resin, to cure an area of the resin corresponding to intermediate motif MT2 developing the resin, to dissolve the non-cured areas and reveal intermediate motif MT2.

FIG. 3 shows an additional layer CS including a first through aperture OS1, a second through aperture OS2, an additional motif MS3, and areas of reduced thickness ZS. Additional layer CS is superposed on an electrically insulating layer CL including a first orifice OL1, a second orifice OL2, a third orifice OL3 and areas of excess thickness ZL. It is noted that the areas of reduced thickness ZS of additional layer CS could alternatively be areas of excess thickness. In such case, areas of excess thickness ZL would be areas of reduced thickness.

Additional layer CS was obtained by a step Pr12_fCS of forming said layer according to the first and second methods Pr1, Pr2. In a non-limiting embodiment of step Pr12_fCS, additional layer CS is formed of a metal alloy plate, for example made of brass, which is cut, for example by laser, to obtain first aperture OS1 and second aperture OS2. It is noted that, in a non-limiting embodiment of step Pr12_fCS, the plate is pre-textured, for example engine-turned or brushed. Further, in a non-limiting embodiment of step Pr12_fCS, additional layer CS is stamped to create an imprint forming a third motif MS3, such as that seen in FIG. 3. Further, in a non-limiting embodiment of step Pr12_fCS, areas ZS of additional layer CS are etched, to diminish the thickness thereof, as represented in FIG. 3. Naturally, these sub-steps of step Pr12_fCS are not all obligatory, and it is possible to perform only some of them.

Insulating layer CL was obtained by a step Pr12_fCL of forming said layer according to the first and second methods Pr1, Pr2. In a non-limiting embodiment of step Pr12_fCL, insulating layer CL is obtained by:

applying a photosensitive resin to additional layer CS, for example an SU-8 type resin. It is noted that the resin then has areas of excess thickness ZL at the areas of reduced thickness of additional layer CS, or vice versa if additional layer CS includes areas of excess thickness.

irradiating the resin through a photomask, with ultraviolet rays in the case of an SU-8 resin, to cure the resin with the exception of the areas facing first aperture OS1, second aperture OS2 and additional motif MS3 developing the resin, to dissolve the uncured areas and reveal a first orifice OL1 superposed on first aperture OS1, a second orifice OL2 superposed on second aperture OS2 and a third orifice OL3 facing additional motif MS3.

FIG. 4 shows the four superposed layers at the end of a superposition step Pr1_sup, Pr2_sup of first method Pr1 and of second method Pr2. More specifically, insulating layer CL is superposed on additional layer CS, which is in turn superposed on intermediate layer CT, in turn superposed on base layer CB. The various orifices, apertures, holes and motifs are such that:

base motif MB1 is positioned inside first hole OT1, first hole OT1 is covered by first aperture OS1 and first orifice OL1 is superposed on first aperture OS1 intermediate motif MT2 is positioned inside second aperture OS2, and second orifice OL2 is superposed on second aperture OS2 additional motif MS3 is positioned facing third orifice OL3.

Then, in a step that is not represented, walls SC (seen in FIG. 5) of base motif MB1, of first orifice OL1, of first aperture OS1, of first hole OT1, and exposed walls of base layer CB are made conductive, for example by PVD conductive film deposition. Naturally, the PVD conductive film deposition is only necessary on faces that are not initially conductive. Thus, in an alternative embodiment, only some of the aforecited walls undergo a PVD deposition or any other equivalent treatment in order to make them conductive. Thus, in an alternative embodiment, only selected walls amongst the aforementioned walls undergo a PVD deposition or any other equivalent treatment making them conductive. During this step, one portion SCL of the upper face of insulating layer CL (i.e. the face not in contact with upper layer CS) at the periphery of first orifice OL1 may also be made conductive.

Likewise, walls of intermediate motif MT2, of second orifice OL2, second aperture OS2, and exposed walls of intermediate layer CT could also be made conductive. The same applies to the walls of additional motif MS3, of third orifice OL3, and the exposed walls of additional layer CS. Likewise, one portion of the upper face of insulating layer CL, at the periphery of second orifice OL2 and/or of third orifice OL3 may also be made conductive.

Figure 5:
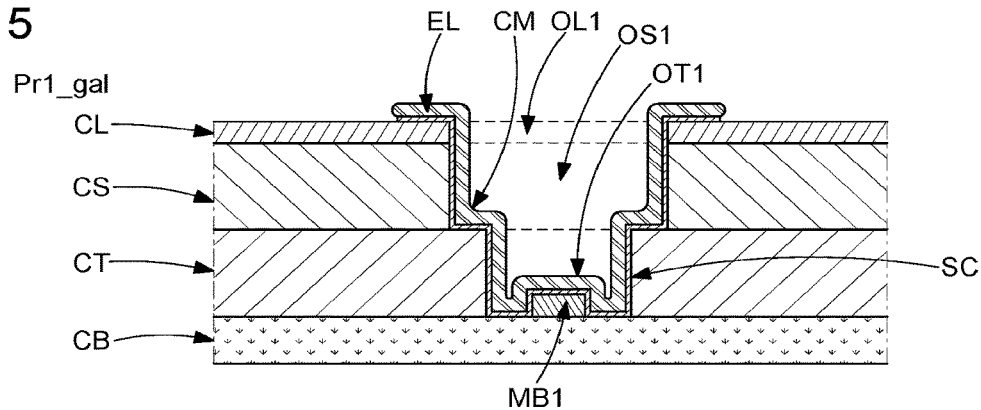
FIG. 5 represents a step of electrodepositing a metal or alloy layer according to the method

FIG. 5 is a schematic view of a step Pr1_gal of electrodepositing a metal or alloy layer CM on the inner faces of first orifice OL1, of first aperture OS1, of first hole OT1, on the faces of base motif MB and on the exposed faces of base layer CB, according to first method Pr1. Thus, the four superposed layers CB, CT, CS and CL are immersed in a galvanic bath suitable for deposition of a metal such as gold, silver, nickel, or any other metal or metal alloy able to be deposited in a relatively thick layer, in order to undergo electroforming. Electroforming is complete when the aforecited walls are completely coated with the metal or alloy layer CM and the thickness of the shell obtained is deemed to be sufficient. Metal or alloy layer CM then includes a lateral area EL which rests on insulating layer CL. In the case where portion SCL of the upper face of insulating layer CL at the periphery of first orifice OL1 has been made conductive, lateral area EL extends at least partly over said portion SCL.

Although not represented, a metal or alloy layer is deposited in a similar manner on the walls of second orifice OL2, of second aperture OS2, of intermediate motif MT2 and on the exposed walls of intermediate layer CT. Likewise, a metal or alloy layer is deposited in a similar manner on the walls of third orifice OL3, of additional motif MS3 and on the exposed walls of additional layer CS. In the case where one portion of the upper face of insulating layer CL at the periphery of second orifice OL2 and/or of third orifice OL3 has been made conductive, lateral area EL extends at least partly over said portion.

Metal or alloy layer CM forms a shell of a certain thickness. Then, in a step that is not represented, insulating layer CL is dissolved by dipping in suitable baths. Lateral area EL could then be cut, depending upon the type of piece to be produced. Cutting lateral area EL is advantageous if the piece to be fabricated is a tool of the punch type for example.

Figure 6:
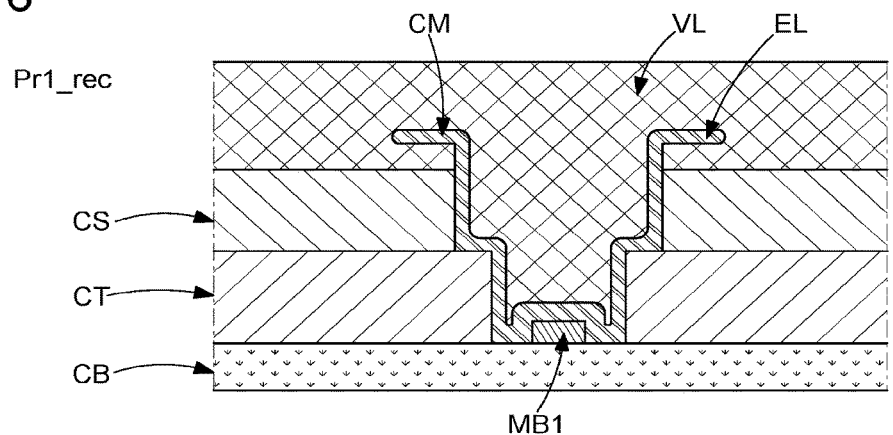
FIG. 6 represents a step of coating or inlaying the metal or alloy layer with a volume of a base material of the piece according to the method

FIG. 6 schematically represents a step Pr1_rec of coating or inlaying additional layer CS and metal or alloy layer CM, with a volume VL of a base material of the piece to be fabricated according to first method Pr1. In one embodiment, the base material is amorphous or partially amorphous metal, which is advantageous for its mechanical properties. In another embodiment, the base material is a polymer or a composite (ceramic polymer, composite carbon fibre, etc.). In both these cases, a block of metal or metal alloy or amorphous or partially amorphous alloy, or polymer or composite, is pressed onto additional layer CS and against metal or alloy layer CM at a temperature at which it has a paste-like consistency. This enables it to deform to conform to the shapes of metal or alloy layer CM, and particularly the shapes of lateral area EL of metal or alloy layer CM if the latter have not been pre-cut. Alternatively, the base material can be cast. In another embodiment, the base material is any other metal or metal alloy, for example nickel, gold, etc., and the coating is achieved by electrodeposition of said metal. It is noted, in the case where lateral area EL has not been pre-cut, that at the end of step Pr1_rec, the metal or alloy layer CM is integral with volume VL of base material, since lateral area EL is sealed inside the base material volume VL. Although not represented, the metal or alloy layers (at intermediate layer MT2 and additional motif MS3) are coated and sealed inside volume VL in a similar manner.

In an alternative embodiment of the coating/inlaying step Pr1_rec, volume VL is not entirely formed of the base material of the piece. In such case, only one part of the volume is formed of the base material of the piece, while the other part is formed of a second material, advantageously less expensive than the base material. The part of volume VL formed of the second material thus advantageously fills the space inside the metal or alloy shell, while the parts of volume VL formed of the base material are located at visible, external places on the piece.

FIG. 7 represents a schematic view of a step Pr1_ext, Pr2_ext of removing volume VL and metal or alloy layers CM, according to first method Pr1 and second method Pr2. In other words, volume VL and metal or alloy layers CM are separated from additional layer CS, from intermediate layer CT and from base layer CB. To achieve this, the assembly is, for example, immersed in a selective acid bath in which additional layer CS, intermediate layer CT and base layer CB are dissolved. Alternatively, separation is achieved by forced demoulding. It is noted that performing a prior surface treatment on additional layer CS facilitates demoulding. This treatment is, for example, application of a demoulding agent or a passivation treatment.

Volume VL then forms piece body PC, and metal or alloy layers CM form exterior elements EH1, EH2 (the third exterior element, resulting from duplication of third motif MS3, is not represented in FIG. 7). It is thus clear that the shapes and dimensions of the exterior elements are directly dependent on the shapes and dimensions of the motifs, and the shapes and dimensions of the various orifices, apertures and holes implemented in the methods.

As a result of the methods described, it is impossible to disengage the exterior elements from the volume of base material without destroying the piece. Further, it is noted that the interfaces between the piece body and the exterior elements are clean. Further, by an imprinting effect of the texture of the additional layer on the volume which occurs in the coating step, the piece body is textured.

Of course, the present invention is not limited to the illustrated example but is capable of various variants and alterations that will appear to those skilled in the art, in particular, as regards the number of superposed layers, the shapes and dimensions of the various orifices, apertures, holes, motifs, etc.

What is claimed is:

1. A method for fabrication of a piece provided with an exterior element, comprising:

superposing an electrically insulating layer including a first through orifice, an additional layer including a first through aperture, an intermediate layer including a first through hole, and a base layer surmounted by a base motif, so as to place the base motif inside the first through hole, cover the first through hole with the first through aperture, and superpose the first through aperture and the first through orifice;

forming an electrically conductive surface on one portion of an upper face of the insulating layer located at the periphery of the first through orifice;

electrodepositing a metal or metal alloy layer, so that at the end of the electrodepositing, the metal or metal alloy layer forms a shell covering walls of the base motif, of the first through orifice, of the first through aperture and of the first through hole, and comprises a lateral area resting on the electrically conductive surface of the insulating layer;

dissolving the insulating layer;

after the dissolving the insulating layer, coating the metal or metal alloy layer with a volume at least partly formed by a base material of the piece, so that an upper end of the metal or metal alloy layer is embedded within the volume; and after the coating, removing the volume and the metal or metal alloy layer together from the additional layer, the intermediate layer, and the base layer such that the volume forms the piece and the metal or metal alloy layer forms the exterior element protruding from an upper surface of the piece.

2. The method according to claim 1, further comprising:
forming an electrically conductive surface on at least one of the walls of the base motif, of the first through orifice, of the first through aperture and/or of the first through hole.

3. The method according to claim 1, further comprising:
forming the base motif on the base layer, including an application, irradiation and development of a photosensitive resin, including an SU-8 resin.

4. The method according to claim 1, further comprising:
forming the base layer from a silicon wafer, including coating said wafer with a conductive film.

5. A method for fabrication of a piece provided with an exterior element, comprising:
superposing an electrically insulating layer comprising a through orifice, an additional layer comprising a through aperture, and an intermediate layer surmounted by an intermediate motif, so as to place the intermediate motif inside the through aperture, and superposing the through aperture and the through orifice;
forming an electrically conductive surface on one portion of an upper face of the insulating layer located at the periphery of the through orifice;
electrodepositing a metal or metal alloy layer, so that at the end of the electrodepositing, the metal or metal alloy layer forms a shell covering the intermediate layer, and walls of the through orifice and of the through aperture, and comprises a lateral area resting on the electrically conductive surface of the insulating layer;
dissolving the insulating layer;
after the dissolving the insulating layer, coating the metal or metal alloy layer with a volume at least partly formed by a base material of the piece, so that an upper end of the metal or metal alloy layer is embedded within the volume; and
after the coating, removing the volume and the metal or metal alloy layer together from the additional layer and the intermediate layer such that the volume forms the piece and the metal or metal alloy layer forms the exterior element protruding from an upper surface of the piece.

6. The method according to claim 5, further comprising:
forming an electrically conductive surface on at least one of the walls of the intermediate motif, of the through orifice and/or of the through aperture.

7. The method according to claim 5, further comprising:
forming the intermediate motif on the intermediate layer, including an application, irradiation and development of a photosensitive resin, including an SU-8 resin.

8. The method according to claim 1, further comprising:
forming the intermediate layer including laser cutting a plate made of brass.

9. The method according to claim 1, further comprising:
forming the additional layer including laser cutting a plate made of brass.

10. The method according to claim 9, the forming the additional layer including stamping the additional layer so as to form therein an additional motif, the electrically insulating layer including a third orifice, the third orifice being placed facing the additional motif when the insulating layer and the additional layer are superposed.

11. The method according to claim 9, the forming the additional layer including an etch of the additional layer to locally diminish the thickness thereof, the insulating layer including areas of excess thickness so that an assembly comprising the superposed additional layer and insulating layer is of constant thickness.

12. The method according to claim 10, further comprising:
forming the insulating layer including an application, irradiation and development of a photosensitive resin, including an SU-8 resin, on the additional layer, so as to form the third orifice.

13. The method according to claim 1, wherein the volume is partly formed of a second material, different from the base material, so that the second material fills the space inside the metal or metal alloy shell.

14. The method according to claim 1, wherein the base material is amorphous or partially amorphous metal.

15. The method according to claim 1, wherein, after the removing, the exterior element includes at least two flat faces that are parallel to each other and parallel to the upper surface of the piece.

16. The method according to claim 5, wherein the base material is amorphous or partially amorphous metal.

17. The method according to claim 5, wherein, after the removing, the exterior element includes at least two flat faces that are parallel to each other and parallel to the upper surface of the piece.

* * * * *